(12) United States Patent
Zeng et al.

(10) Patent No.: US 8,416,570 B2
(45) Date of Patent: Apr. 9, 2013

(54) OPEN FRAME ELECTRONIC CHASSIS FOR ENCLOSED MODULES

(75) Inventors: Guang Zeng, Mississauga (CA); Roger Moore, Beeton (CA); Phil Levy, Brampton (CA); Yuri Luskind, Thornhill (CA)

(73) Assignee: Ruggedcom Inc., Ontario (CA)

( * ) Notice: Subject to any disclaimer, the term of this patent is extended or adjusted under 35 U.S.C. 154(b) by 156 days.

(21) Appl. No.: 13/156,124

(22) Filed: Jun. 8, 2011

(65) Prior Publication Data

US 2012/0147560 A1    Jun. 14, 2012

Related U.S. Application Data

(63) Continuation of application No. 12/473,558, filed on May 28, 2009, now Pat. No. 7,974,093.

(30) Foreign Application Priority Data

May 15, 2009    (CA) ...................................... 2666014

(51) Int. Cl.
*H05K 7/20*    (2006.01)
(52) U.S. Cl.
USPC .................. 361/690; 361/679.23; 361/679.33; 361/679.39; 361/679.48; 361/704; 361/715; 361/719; 165/80.3; 165/104.33; 165/185; 454/184
(58) Field of Classification Search ............. 361/679.01, 361/679.23, 679.33, 679.46–679.54, 690–697, 361/704–717, 719–727; 165/80.3, 104.33, 165/185; 439/61, 64, 76, 633, 677, 680, 439/620, 945, 928.1; 211/41.12, 41.17; 454/184; 312/223.2, 223.3, 236; 175/50, 50.52, 520
See application file for complete search history.

(56) References Cited

U.S. PATENT DOCUMENTS

| | | | |
|---|---|---|---|
| 4,398,779 | A | 8/1983 | Ling |
| 4,466,049 | A | 8/1984 | Chaney et al. |
| 4,510,533 | A | 4/1985 | Tokuyama |
| 4,920,453 | A | 4/1990 | Onose et al. |
| 5,436,794 | A | 7/1995 | Clemente et al. |
| 5,828,546 | A | 10/1998 | Tirrell et al. |
| 5,872,701 | A | 2/1999 | Hayden et al. |
| 5,940,288 | A | 8/1999 | Kociecki |
| 6,166,919 | A | 12/2000 | Nicolici et al. |
| 6,175,501 | B1 | 1/2001 | Bortolini et al. |
| 6,661,664 | B2 | 12/2003 | Sarno et al. |
| 6,741,466 | B1 | 5/2004 | Lebo |
| 6,771,514 | B1 | 8/2004 | Elg |

(Continued)

FOREIGN PATENT DOCUMENTS

JP    02000232287 A    8/2000

*Primary Examiner* — Michail V Datskovskiy

(57) ABSTRACT

An open frame chassis has a top opening and a bottom opening permitting ambient airflow. A plurality of modules, each enclosing electrical components in thermal contact with a heat sink area of their corresponding module, can each be inserted in the chassis. Ambient air may flow from the bottom opening across the heat sink area of each module to the top opening to passively cool the modules and electrical components. Key pins guide the modules into place and prevent incorrect insertion of a different type of electrical module not corresponding to the electrical connection of the chassis for that slot. Guide pins on corners of the modules mate with guide holes in the chassis to secure the module to the chassis and decrease vibration. Both sides of the chassis have side openings through which the fins of the modules in the end slots of the chassis may be exposed.

22 Claims, 12 Drawing Sheets

U.S. PATENT DOCUMENTS

| | | |
|---|---|---|
| 6,839,232 B2 | 1/2005 | Elo et al. |
| 7,079,381 B2 | 7/2006 | Brehm et al. |
| 7,731,533 B2 | 6/2010 | Nguyen et al. |
| 2005/0146855 A1 | 7/2005 | Brehm et al. |
| 2009/0122500 A1 | 5/2009 | Metzger |
| 2010/0097767 A1 | 4/2010 | Jude et al. |

US 8,416,570 B2

OPEN FRAME ELECTRONIC CHASSIS FOR ENCLOSED MODULES

CROSS REFERENCE TO RELATED APPLICATIONS

This application claims the priority benefit under 35 U.S.C. 119 of Canadian Application No. 2666014, filed on May 15, 2009, and is a continuation of U.S. Ser. No. 12/473,558 filed on May 28, 2009 now U.S. Pat. No. 7,974,093.

FIELD OF THE INVENTION

This invention relates to modular electronic systems having a chassis and modules that are hot-swappable. More particularly, the present invention relates to a passively cooled modular electronic system having an open-frame chassis permitting air flow around and through a plurality of modules each module encasing heat generating electrical devices therein.

BACKGROUND OF THE INVENTION

In the past, there have been many different types of modular electronic systems having a chassis with a variety of modules that can be interconnected to the back plane of the chassis. However, the electrical components in the modules tend to generate large amounts of heat when they are in use. Therefore, to accommodate the heat generated by the electrical components these conventional electronic systems generally use fans or other air moving means to force air flow across the modules in order to dissipate the generated heat. However, the forced-air cooled modular electronic systems do not operate well in harsh environments for a number of reasons. First, in harsh environmental conditions, it is not always possible to have the fan operational and a fan failure may not become immediately apparent, which may cause other components to fail before the fan failure is noticed. Second, in harsh environmental conditions, which tend to also be dirty conditions, the air generally has dust and other airborne contaminants contained therein, such that perpetually forcing air around delicate electronic components may eventually cause undesired failures decreasing the "Mean Time Between Failures" (MTBF) of the modules.

To address some of the MTBF issues and provide more reliable operation, conduction-cooled enclosed chassis have been used in the past in some harsh environmental conditions. However, because conduction cooled enclosed chassis are enclosed, they are not modular and do not permit reconfiguration of the systems by the exchange of modules therein. Furthermore, such conduction cooled enclosed chassis must be entirely replaced even if a single component fails. As a result, such conduction cooled enclosed chassis give rise to maintenance and replacement issues in the field, which cause Mean Time To Repair (MTTR) to decrease.

Furthermore, in addition to protecting the electrical components against harsh environmental conditions, including dust, dirt and heat, it is also desirable to protect the electrical devices from shock and vibration. An acute shock, or prolonged vibration, may lead to failure of highly sensitive electronic devices thereby also decreasing the mean time between failures (MTBF).

Accordingly, there is a need in the art to provide a modular electronic system which can operate in harsh environments without the use of a forced air cooling system. There is also a need in the art for a modular electronic system which is resistant to environmental conditions, such as dirt, vibration and shock to approve desired MTBF and MTTR levels.

SUMMARY OF THE INVENTION

Accordingly, it is an object of this invention to at least partially overcome some of the disadvantages of the prior art. Also, it is an object of this invention to provide an improved type of modular electronic system which is passively cooled.

In one aspect, the present invention provides an open frame chassis having openings at the top, bottom and sides permitting air flow through the open frame chassis, to the extent possible. The chassis receives modules which have electrical components completely enclosed therein. The modules have a heat sink area, which in a preferred embodiment consists of integrated fins that are in thermal contact with the electrical components contained within the module. The modules are inserted into the open frame chassis to an inserted position and held at the inserted position by supports. At the inserted position, a module is in electrical contact with the open frame chassis and the heat sink area of the module is oriented between the top opening and the bottom opening of the open frame chassis. In this way, the heat sink fin area extends vertically from the bottom opening to the top opening forming an air flow path across the heat sink area. The pressure differential built up by heat generated by the electrical components in each module and conducted through the module to the heat sink fin area builds up an air pressure differential creating convection air currents from the bottom opening through the heat sink fin areas and out the top opening of the open frame chassis, which permits passive dissipation of the heat generated by the electrical components in the module.

The modules enclose different types of electrical components, such as optical transceivers, integrated circuits, microprocessors and, for the power module, power generation circuitry including transformers and capacitors. The components which generate more heat are preferably mounted on the top side of the circuit card assemblies in closer contact to the heat sink fin area. Internal heat sink conductors and thermal interface materials are used for facilitating the conduction of heat away from the electrical components and towards the heat sink fin area of the module.

Accordingly, in one of its aspects, this invention resides in a passively cooled modular electronic system comprising: an open-frame chassis having a bottom opening and a top opening permitting ambient air flow there through; a module enclosing electrical components and having a heat sink area, said electric components in thermal contact with said heat sink area of said module; an electrical connection on the open frame chassis for removably electrically connecting the module to the open-frame chassis; a support for holding the module at an inserted position where the module is in electrical contact with the electrical connection and where the heat sink area is aligned with the bottom opening and the top opening to permit ambient air flow from the bottom opening across the heat sink area and out the top opening to passively cool the electrical components in the module.

In a further aspect, the present invention resides in a module for use in a passively cooled modular electronics system having an open frame chassis with a top opening and a bottom opening, said module comprising: a casing for enclosing electronic components therein; an electrical connector for connecting the module to the open frame chassis; a heat sink area in thermal contact with the electrical components; wherein the casing enclosing the electrical components is inserted into an inserted position within the open frame chassis with the electrical connector in electrical contact with the open frame chassis, and, the heat sink area aligned between the top opening and the bottom opening of the open frame chassis to permit ambient air flow from the bottom opening across the heat sink area and out the top opening of the open frame chassis to passively cool the electrical components in the module.

Accordingly, in one aspect, the present invention provides an open frame chassis having a top opening and a bottom opening permitting ambient air flow through the open frame chassis. In this way, the chassis is not enclosed but rather hot swappable modules connected to the back plane of the chassis will be exposed to ambient air and convection currents can be formed from the bottom opening to the top opening to passively cool the electrical components enclosed in the modules. In this way, natural convection can be used to passively cool the electrical components enclosed in the module without the use of forced air cooling. Nevertheless, forced air in the form of fans may also be used if desired or required for particular applications.

In another aspect of the present invention, the modules fully enclose their electrical components such that no ambient air can enter into the modules. Rather, internal conductive surfaces spread and transfer heat to the heat sink area of the module which in a preferred embodiment comprises die cast integrated heat fins. In this way, heat generated by the electrical devices can be directed within the modules towards the heat sink area to dissipate the generated heat in a controlled manner. Furthermore, because the modules are completely enclosed, there is no concern of dirt or dust coming into contact with the electrical components contained in the module thereby increasing the mean time between failures of the modules.

In a further preferred embodiment, the modules are all of the same shape and size. This decreases the cost associated with manufacturing the modules. Preferably the modules are made of aluminium to provide a module of reasonable weight, and also improve heat transfer abilities. It is understood that any material which is a relatively good conductor of heat would preferably be used as the casing for the modules.

In a further aspect of the invention, the modules preferably have unique key housing for each type of module. The key housing of the modules preferably have key holes which mate with key pins on the back plane of the chassis, which key pins are oriented in different positions so that each type of module can be connected only to the corresponding type of chassis electrical connection in the back plane. In this way, the correct type of module will be inserted into the correct slot in order to avoid damaging the electrical connections on the module and the back plane. Preferably, the key pins extend from the back plane a greater distance than the electrical connections, to ensure that the key pins engage the module key housing before the electrical connections meet, thereby avoiding the possibility of damaging the electrical connections in the module and back plane. The key pins are also selected in the back plane such that, even if an incorrect module is inserted into the slot, the key pins will not contact the electrical connection on the module, but rather will contact a flat surface area so as not to damage any electrical connections on the module.

In another aspect of the invention, the modules have guide pins or alignment pins to decrease vibration and shock to the module, and more particularly, the electrical components contained therein. The module guide pins engage corresponding alignment holes in the chassis to secure the module to the chassis.

In a further aspect of the present invention, the modules have rails which extend along the length of the module in an insertion direction and engage channels in the open frame chassis. The channels may extend across the bottom opening and/or top opening, but are preferably narrow to avoid excess interference with the ambient air flow through the top and bottom openings. During insertion, the rail on the module engages the channel and is slid along the channel in an insertion direction until the module is at the inserted position. Preferably, the rails are located remotely from the heat sink area so that the channel and rail do not impede ambient air flow across the heat sink area when the module is in the inserted position. In a preferred embodiment, the heat sink area extends along a first side wall of the module and the rail extends along the bottom of the module adjacent a second side wall of the module opposed to the first side wall.

Further aspects of the invention will become apparent upon reading the following detailed description and drawings, which illustrate the invention and preferred embodiments of the invention.

BRIEF DESCRIPTION OF THE DRAWINGS

In the drawings, which illustrate embodiments of the invention:

FIG. 9b is a perspective partially broken-out section view of the module shown in FIG. 9a.

DETAILED DESCRIPTION OF THE PREFERRED EMBODIMENTS

Preferred embodiments of the invention and its advantages can be understood by referring to the present drawings. In the present drawings, like numerals are used for like and corresponding parts of the accompanying drawings.

Figure 1:
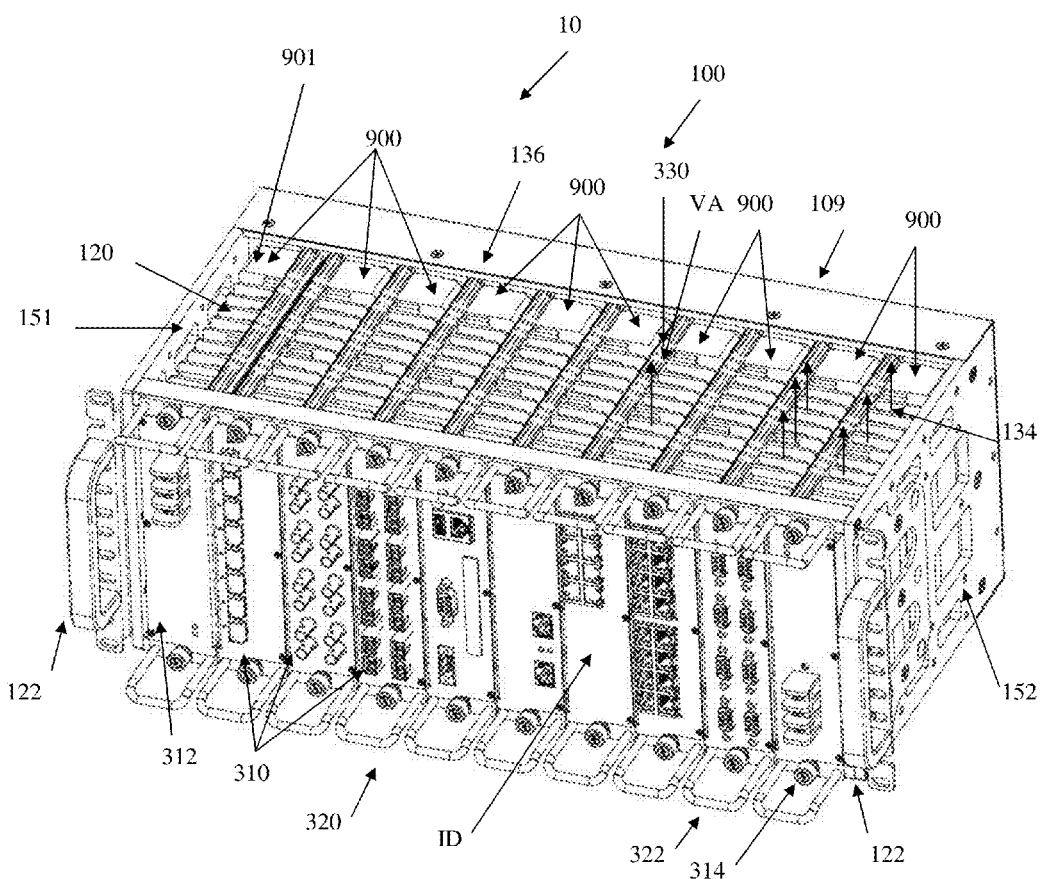
FIG. 1 is an exemplary perspective view of an open-frame modular electronic system package supported on an open frame chassis and having electronic module installed thereon according to one embodiment of the present invention.

As shown in FIGS. 1 and 3 to 6, one embodiment of the present invention provides a passively cooled module electronic system, as shown generally by reference numeral 10. The passively cooled modular electronic system 10 comprises an open frame chassis, as shown generally by reference numeral 100, and at least one and preferably a plurality of modules 900. While FIG. 1 shows modules in all of the slots 163 of the open frame chassis, it is understood that modules 900 may only be present in some of the slots 163.

Figure 2:
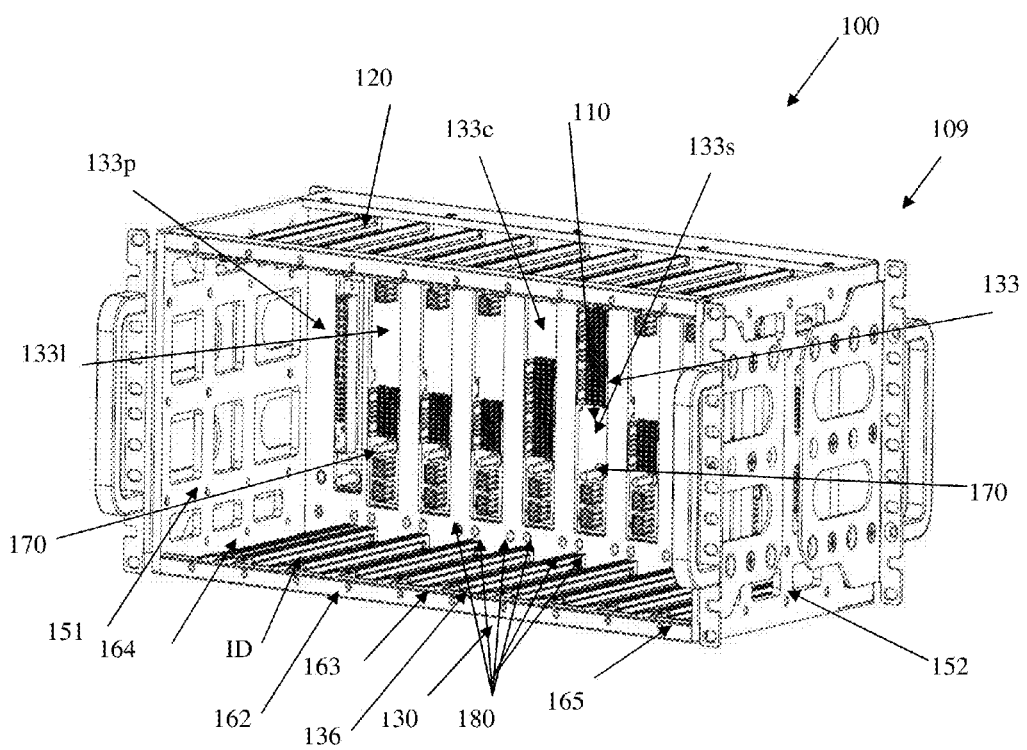
FIG. 2 is an exemplary depiction of the open frame chassis and backplane of the open frame chassis of FIG. 1, but with no module installed therein.

The open frame chassis 100 is better shown in FIG. 2 where all the modules 900 have been removed from the slots 163. As illustrated in FIG. 2, the open frame chassis 100 comprises a bottom opening 130 and a top opening 120. It is understood that preferably the bottom opening 130 and top opening 120 are open to the extent possible while still permitting support 136 to hold the modules 900 in an inserted position, which inserted position is shown generally by reference numeral 901 in FIG. 1, in the open frame chassis 100. Having larger openings 120, 130 permits air currents to be formed and maintained more easily. Furthermore, having larger openings 120, 130 prevents the accumulation of dirt and dust which could clog smaller openings.

Figure 3:
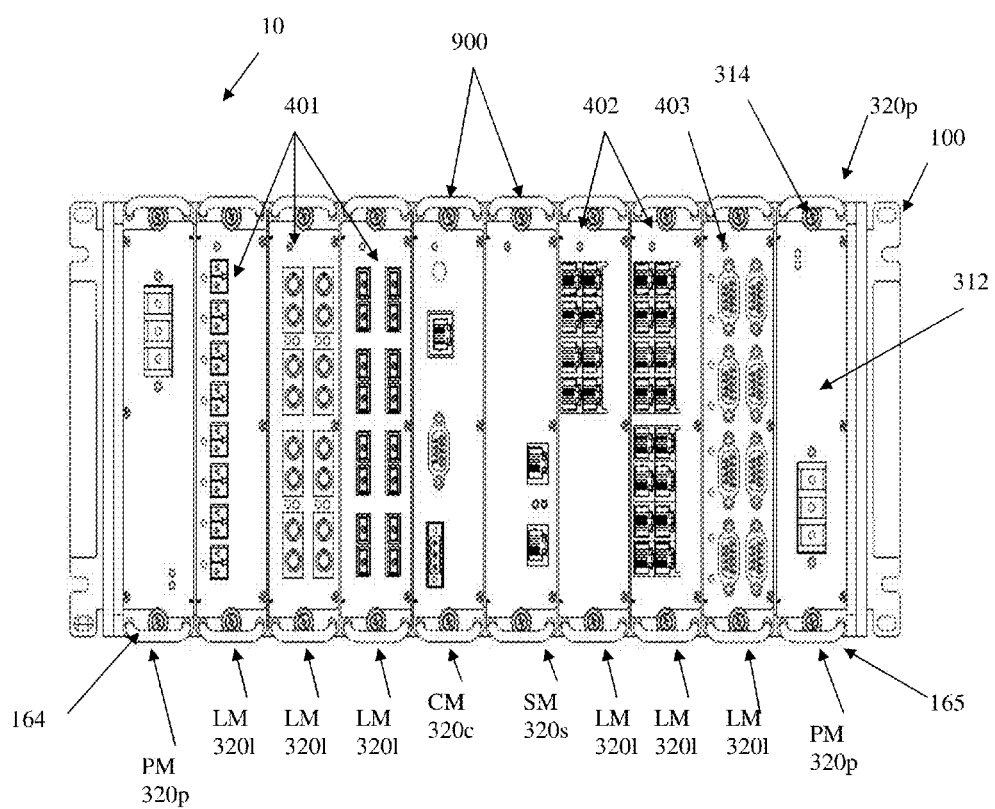
FIG. 3 is an exemplary front elevation view of a modular electronics system shown in FIG. 1 including two power supply modules (PM), one control module (CM), one switch module (SM), and six communication modules (LM) installed in an open-frame chassis according to one embodiment of the present invention.

The chassis 100 has a chassis cover 109 which covers the back plane 110. The back plane 110 comprises a number of electrical connections 133. In a preferred embodiment, and discussed more fully below, the modules 900 may have different types of module electrical connections 333 corresponding to each type 320 of module 900. The back plane 110 has corresponding types of chassis electrical connections 133 corresponding to each type of module electrical connection 333 to be inserted into the open frame chassis 100. As illustrated in FIG. 3, the types of chassis electrical connections 133 may include a power module electrical connection 133p, a line module electrical connection 133l, a switch module electrical connection 133s and a control module electrical connection 133c. Generally, the type 320 of module 900 that may be inserted into a corresponding slot 163 in the open frame chassis will correspond to the electrical connection 133 in the back plane 110. To ensure that one type 320 of module 900 is not inserted into a slot 163 having a different type of electrical connection 133, the back plane 110 comprises key pins 170 which engage corresponding key holes 380 in the modules 900.

The modules 900 also have a heat sink area, shown generally by reference numeral 330. This heat sink area 330 facilitates dissipation of heat generated by the electrical components in the module 900. The electrical components 902 in the module 900 are in thermal contact with the heat sink area 330 of the module 900 to facilitate transfer of heat generated by the electric components 902 to the heat sink area 330.

Figure 9A:
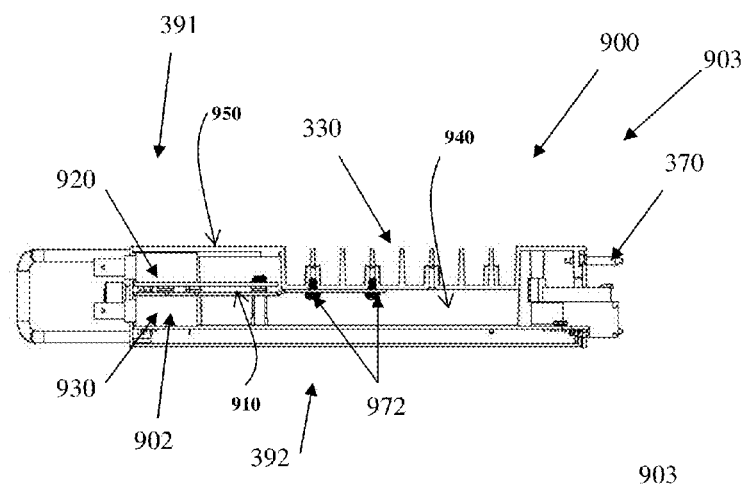
FIG. 9a is an exemplary broken-out side section view of a module, showing an internal heat conduction path according to one embodiment of the present invention.
Figure 9B:
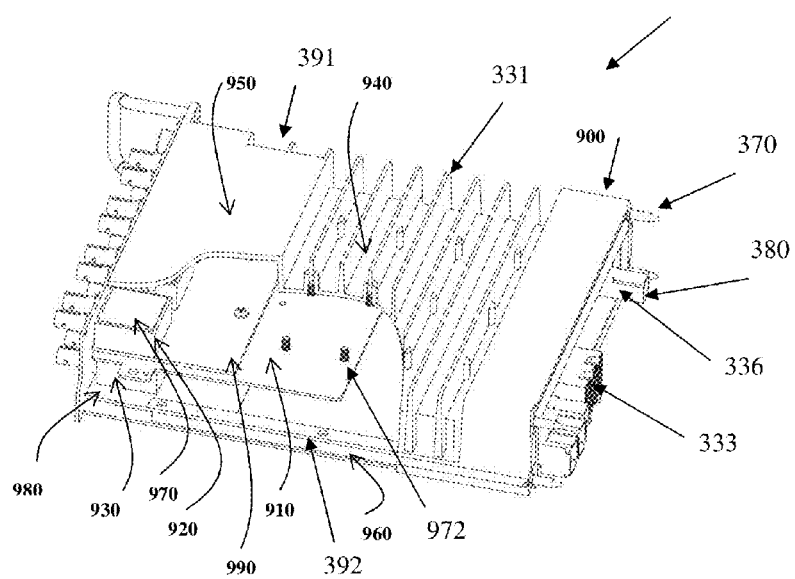

As illustrated in FIGS. 9A and 9B, the modules 900 enclose electrical components 902 therein. The electrical components 902 may be any type of electrical components 902 that can be enclosed in a module 900 and used in a chassis 100. In FIG. 9A, the module 900 is shown as having a bottom level optical transceiver heat source on the daughter peripheral component board (PCB) 920 and a top level optical transceiver heat source on the main PCB 930. However, it is understood that any type of electrical components 902 can be contained within the module 900. The module 900 also has electrical connections 333 for the corresponding electrical components 902 which mate with the chassis electrical connections 133 to removably electrically connect the module 900 to the open frame chassis 100.

As illustrated in FIG. 1, the supports 136 hold each of the modules 900 at an inserted position 901, where the module 900 is in electrical contact with the electrical connections 133 of the open frame chassis 100, and, the heat sink area 330 is aligned with the bottom opening 130 and the top opening 120 of the open frame chassis 100. This permits air to flow along the air flow path 134 from the bottom opening 130 across the heat sink area 330 and out the top opening 120 to passively cool the electrical components 902 in the module 900.

Figure 10:
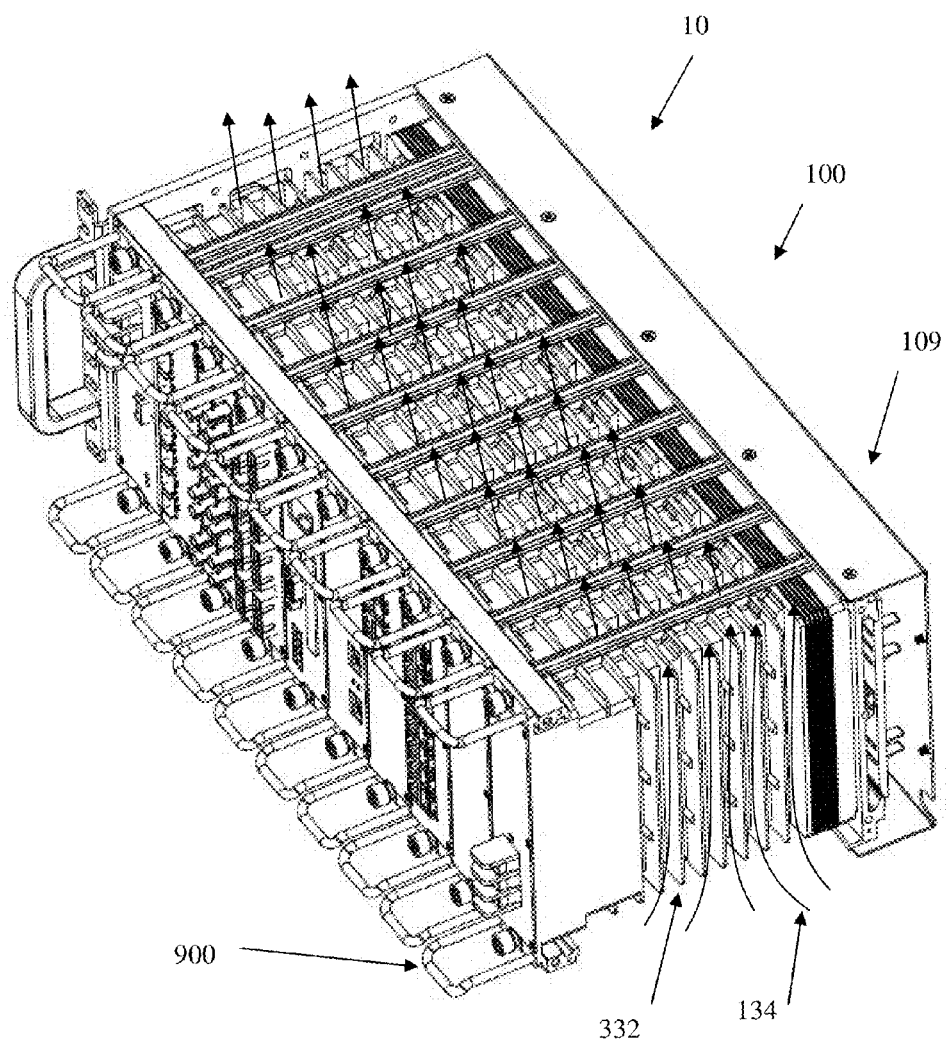
FIG. 10 is an exemplary thermal modeling of airflow over a fin field of each module.

FIG. 10 shows a field of heat sink areas 330 with the corresponding air flow paths 134 passing across each of the heat sink areas 330 of a plurality of modules 900. As the heat sink areas 330 become hotter due to the heat generated by the enclosed electrical components 902, a pressure differential will be created as the hot air around the heat sink area 330 is heated, expands and rises. Additional ambient air will then flow in to take the place of the previously heated air creating the air flow path 134 from the bottom opening 130 across the heat sink area 330 and out the top opening 120. Furthermore, the modules 900 having components 902 which generate more heat and will generate more of a pressure differential thereby drawing additional air flow 134 across the heat sink area 330 to the hotter modules 900. In this way, the passively cooled modular system 10 is self regulating in that the modules 900 having components 902 that generate more heat will correspondingly generate further air flow to further facilitate heat dissipation.

As illustrated in the figures, in a preferred embodiment the heat sink area 330 comprises a heat sink fin area 332 having a plurality of fins 331. The fins 331 preferably extend along the vertical axis VA shown in FIG. 1 when the modules 900 are in the inserted position 901. In this way, heat generated by the electrical devices 902 and conducted to the heat sink fin area 332 will facilitate the heating and rising of air across the heat sink area 330. Accordingly, it is understood that preferably the open frame chassis 100 is oriented such that the heat sink fin areas 332 are oriented vertically, however it is understood that other orientations are still operable, but may be less efficient. It is also preferred that there is spacing between the top and bottom openings 120, 130 of the open frame chassis 100 and other elements (not shown) in the rack (not shown) in order to permit ambient air flow. This spacing preferably 1.75 inches or more.

Figure 8A:
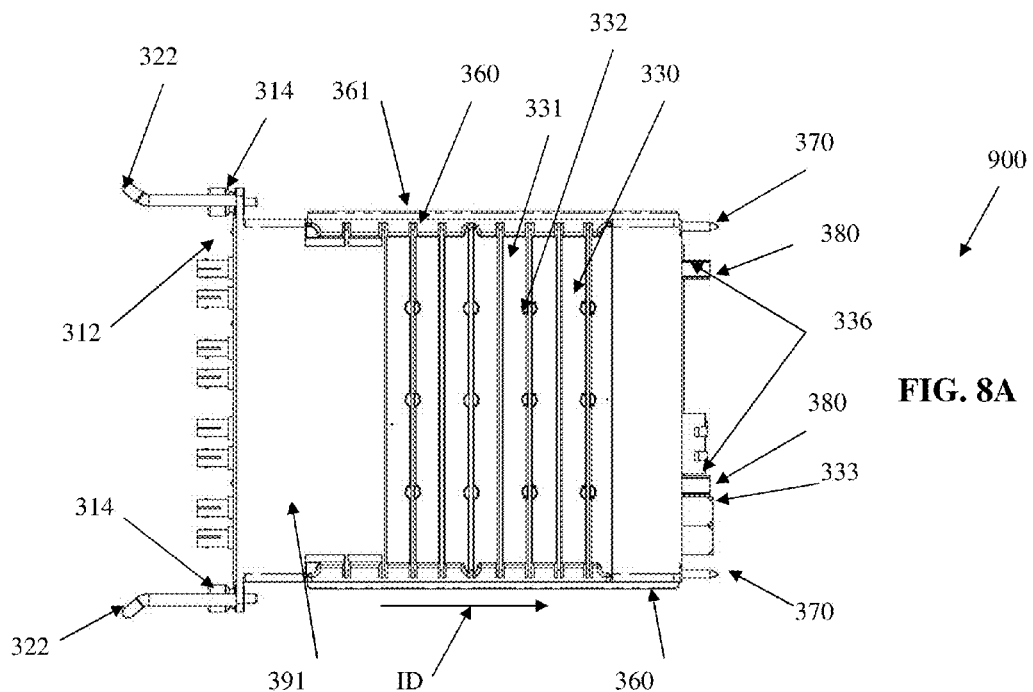
FIG. 8a is a side view of a module shown in FIG. 7.
Figure 8B:
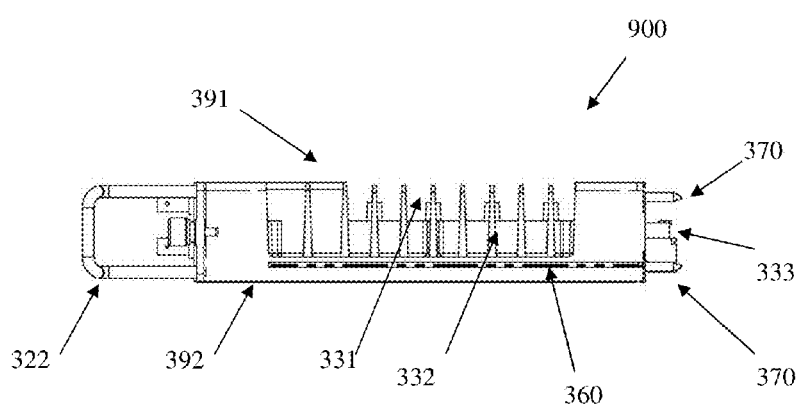
FIG. 8b is a bottom view of the module shown in FIG. 7.
Figure 8C:
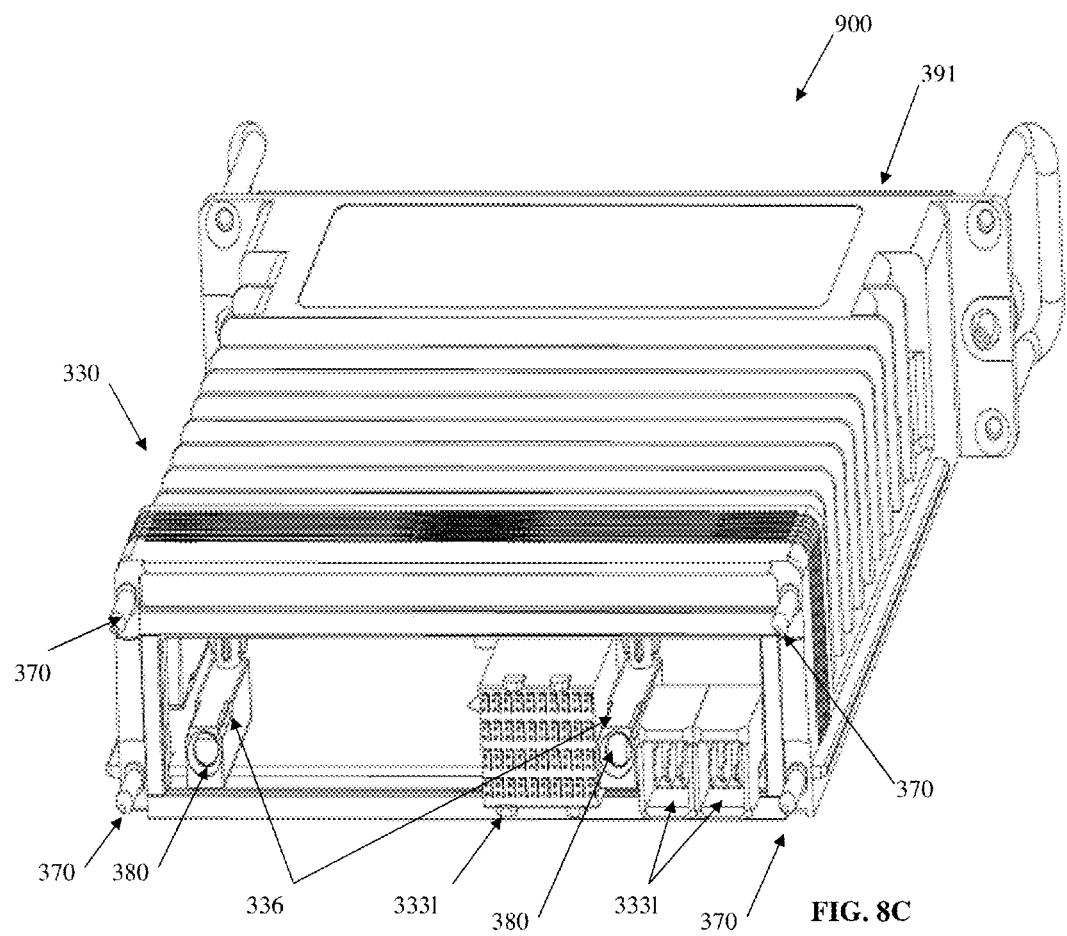
FIG. 8c is a rear perspective view of the module shown in FIG. 7.
Figure 11:
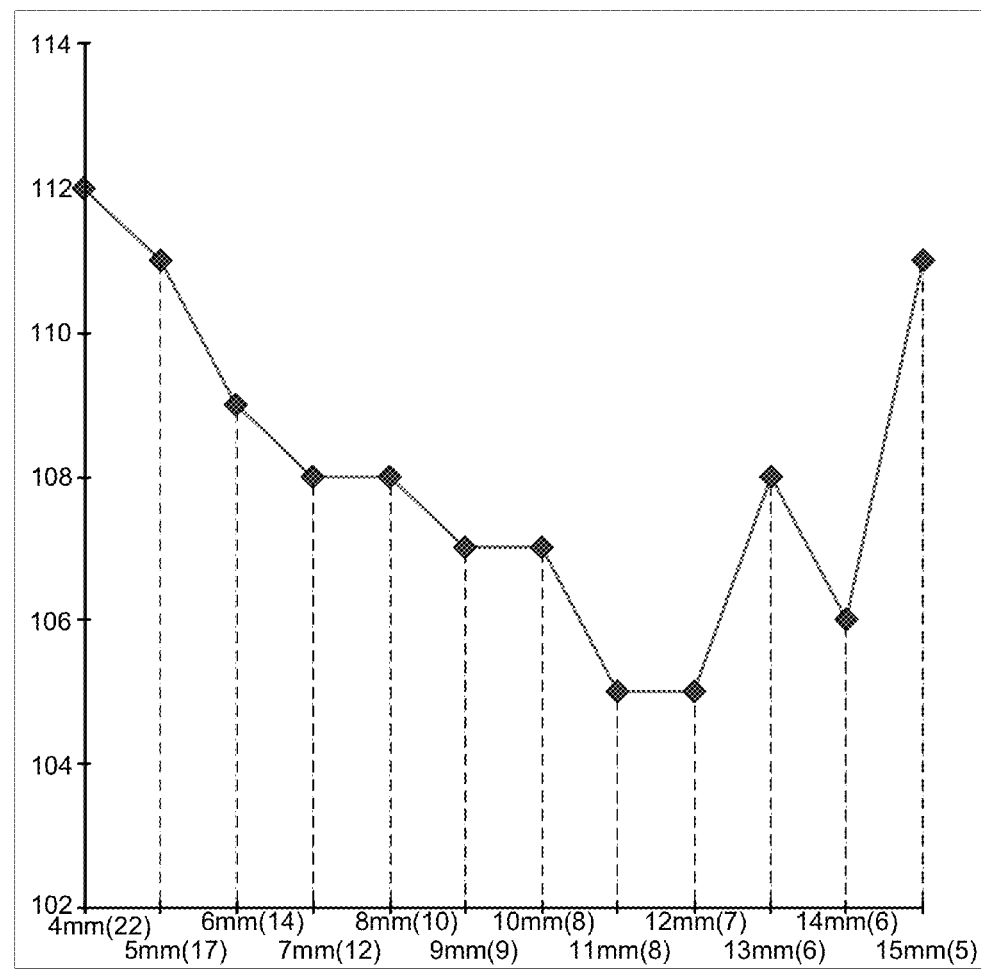
FIG. 11 is a graphical representation showing temperature along the Y axis and fin spacing (fin number) along the X axis representing the temperature of the electrical components in a module according to one embodiment of the present invention generating 10 watts of heat and 85° C. ambient temperature at different fin spacings where the fin area is 100 mm by 93 mm, the fin height is 14.8 mm and the fin thickness is 1.9 MM.

In a preferred embodiment, where the heat sink area 330 comprises a heat sink fin area 332 having a plurality of fins 331, the fins 331 are separated by a distance of between 6 mm and 14 mm. More preferably, the fins 331 are separated by a distance of between 9 mm and 12 mm and have a height of 14 mm to 20 mm. This preferred orientation and sizing has been determined based on modelling as illustrated in FIG. 11. In particular, FIG. 11 is a graphic presentation showing the temperature along axis Y in degrees Celsius and the fin spacing, as well as fin number in brackets along the X axis. The model illustrated in FIG. 11 is based on a module 900 as shown in FIG. 8a to FIG. 8c in an ambient temperature environment of 85° C. and having electrical components 902 generating 10 watts of heat. The heat sink fin area 332 is presumed to be constant at 100 mm by 93 mm and the height is considered to be 14.8 mm and the fin thickness is 1.9 mm. It is understood that while the number of fins 331 increase, the fin spacing decreases because the fin area 332 remains constant. Therefore, there is a balance between the number of fins 331 possible in the heat sink area 330 and the spacing between the fins 331. As shown in FIG. 1, the temperature decreases noticeably when the fins 331 are separated by a distance of 6 mm and 14 mm. More preferably, there is a further noticeable drop in temperature when the fins 331 are separated by a distance of between 9 mm and 12 mm. This is particularly true in the present case where the height of the fins is 14.8 mm, but would also be the case if the fin height extended up to 20 mm assuming the spacing of the modules 900 in the open frame chassis 100 and the orientation of the components 902 in the module 900 permitted this height of fins 331.

Figure 5:
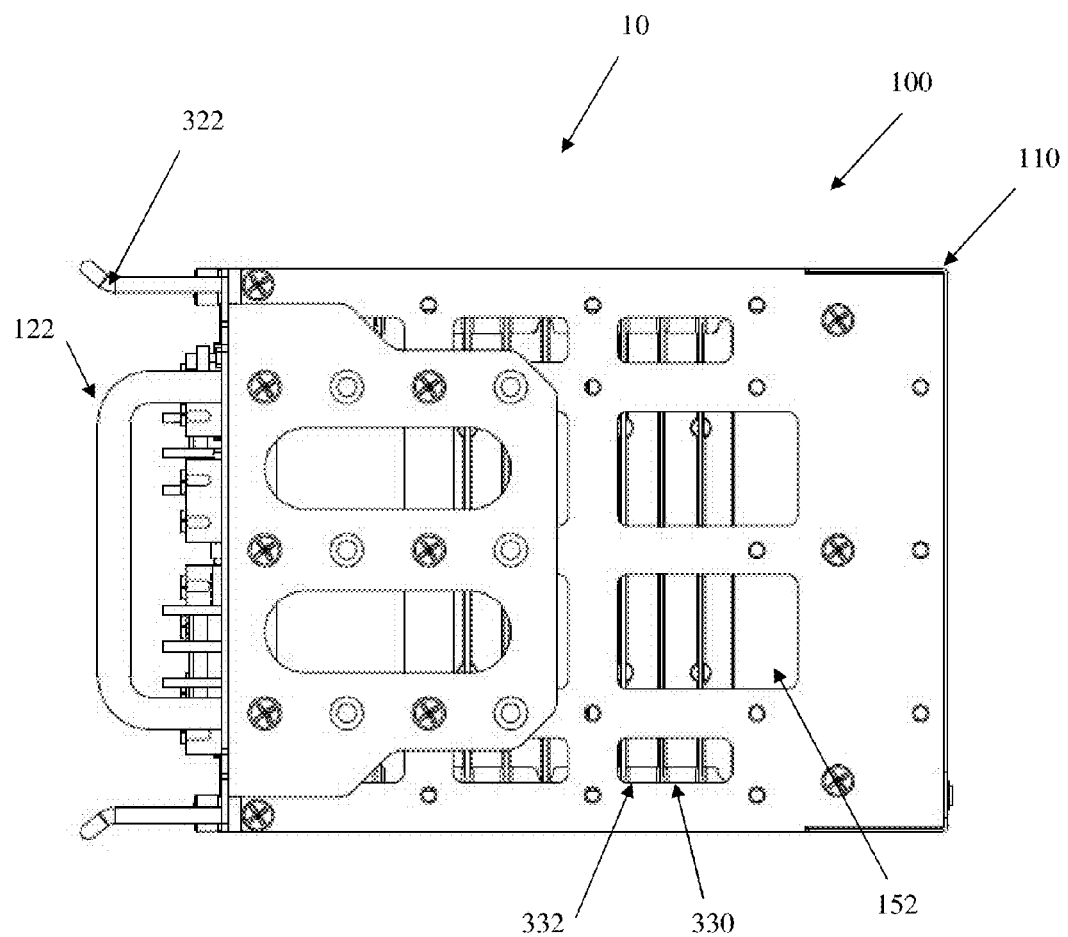
FIG. 5 is an exemplary right side view of the open-frame modular electronic system shown in FIG. 1.
Figure 6:
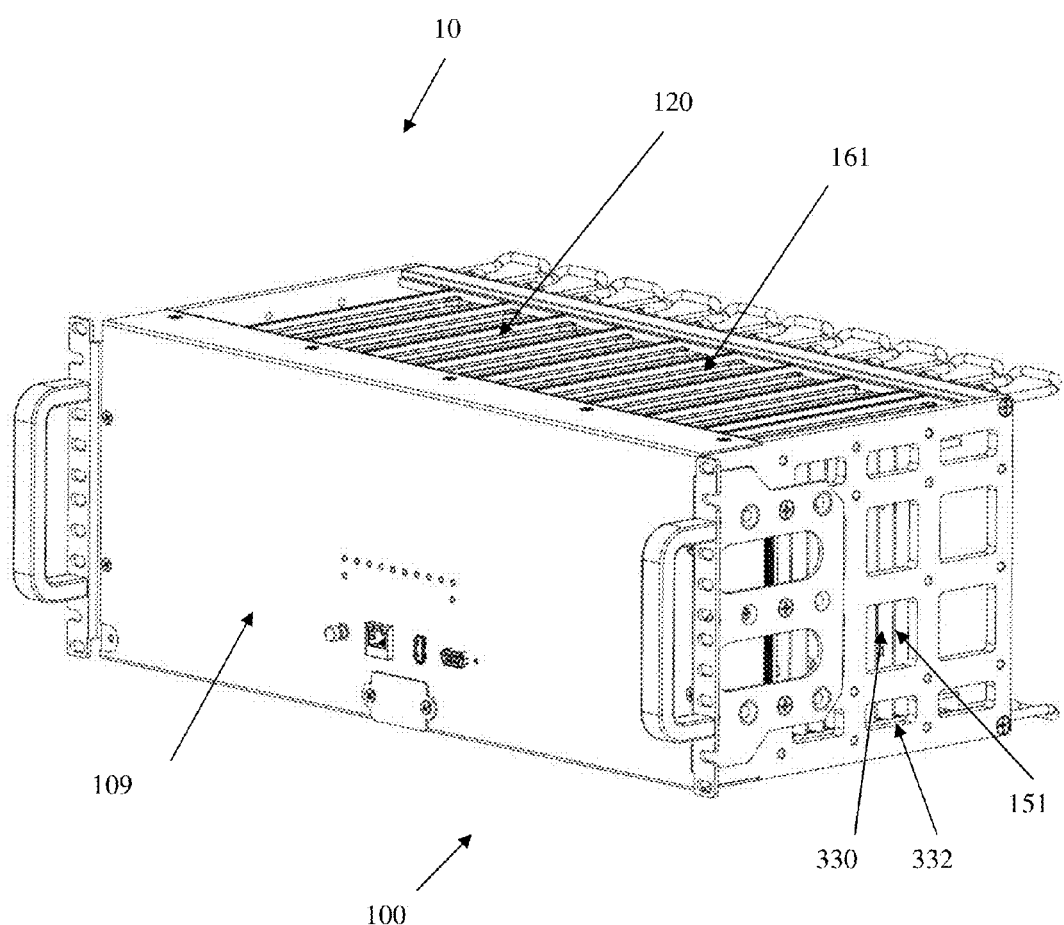
FIG. 6 is an exemplary rear perspective view of the modular electronic system shown in FIG. 1.

In addition to the top and bottom openings 120, 130, the open frame chassis 100 also preferably comprises a left side opening 151 and a right side opening 152 as shown, for instance, in FIGS. 5 and 6. This permits added ambient air flow across the module 900 inserted into the end slots 164, 165 through the side openings 151, 152. Because of this, it is preferred that modules 900 which tend to generate the most heat will be placed at the end slots 164, 165. Because the power module 320p tends to generate the most heat, it is preferred if the end slots 164, 165 have power module electrical connections 133p. In this way, the power modules 320p, which tend to generate the most heat, will have the added benefit of air flow from the left side opening 151 and the right side opening 152 across the heat sink area 330.

FIG. 3 illustrates the different types of modules 320 p, l, s, c which are also identified by their two letter codes. For instance, as shown in FIG. 3, the end slots 164, 165 have power modules (PM) 320(p) inserted therein. As discussed above, this is preferred because the power modules PM 320 (p) generate the most heat and the open frame chassis 100 has side openings 151, 152. As is also apparent from FIG. 3, the power modules PM 320(p) are reversed for reasons which will be discussed more fully below. The other modules shown in FIG. 3 include the line modules (LM) 320(l), the switch module (SM) 320(s) and the control module (CM) 320(c) which performs different functions. It is appreciated that the electrical components 902 in each of the modules 900 will perform specific functions in the network.

Each of the modules 900 preferably have external connections on their front input/output side 312. These electrical connections include fiber optic connections 401, RJ 45 connections 402 and D-subminiature connection 403. It is understood however that any type of connections may be present on the input/output side 312 of the modules 900.

Each of the modules 900 also have panel mount screws 314. The panel mount screws engage holes on the open frame chassis 100 to urge the modules 900 towards the back plane 110 of the chassis 100. The modules 900 may also have handles 322 for lifting and moving the modules 900. It is understood that if the modules 900 have a metal casing 903, which may be relatively heavy and the module handles 322 facilitate movement of the module 900.

As indicated above, the chassis 100 will have different electrical connections 133, p, l, s, and c for connecting to a corresponding different type 320 of module 900. The different types 320 p, l, s, c of modules 900 will connect to a corresponding chassis electrical connection 133 p, l, s, c and the support 136 will be present for each of the types 320 p, l, s, c of the modules 900 at the inserted position 901 where the heat sink area 330 is aligned with the bottom opening 130 and the top opening 120. In this inserted position 901, the air flow path 134 permits air to flow from the bottom opening 130 across the heat sink area 330 of each of the modules 900 and out the top opening 120 to passively cool the electrical components 902 in each of the modules 900.

To prevent incorrect insertion of a different type of module 900 with a non-corresponding type of chassis electrical connection 133, the system 10 comprises key pins 170 associated with each type of electrical connection 133 p, l, s and c. Each of the key pins 170 have a unique orientation for each type of chassis electrical connection 133 p, l, s, c and mate with the corresponding key holes 380, shown for instance in FIGS. 8a to 8c, on the module key housing 336 of each type 320 p, l, s, c of module 900. As is apparent for instance from FIG. 2, the key guides 170 will be at a different location in the back plane 110 corresponding to the type of electrical connection 133 p, l, s, c. In this way, if the incorrect type 320 p, l, s, c of module 900 is inserted into one of the slots 163, the key pins 170 will not mate with the corresponding key holes 380 on the module key housing 336 of the module 900 thereby prevent the full insertion of the module 900 completely into the inserted position 901 of the slot 165. Preferably, the key guides 170 are longer than the chassis electrical connections 133. In this way, the key guides 170 will contact the module 900 before the chassis electrical connections 133 contact the key housing 336 of the incorrect module electrical connections 333 which could avoid or lessen any potential damage resulting from incorrectly inserting a type 320 of module 900 into slot 165 with a chassis electrical connection 133 p, l, s, c which does not correspond to the type of module electrical connector 333 for that type 320 p, l, s, c of module 900.

Modules also preferably comprise module guide alignment pins 370, illustrated for instance in FIG. 8a to FIG. 8c. These module guide alignment pins 370 mate with corresponding alignment holes 180 (shown in FIG. 2) in the back plane 110 of the chassis 100 to decrease vibration and avoid shocks between the module 900 and the open frame chassis 100. Preferably, the module guide alignment pins 370 are located at the four corners of each module 900 as illustrated for instance in FIG. 8c and FIG. 9b. It is understood that having the module guide alignment pins 370 as far apart as possible and at the corners of the module 900 will improve resistance to external forces including rotational and vibrational forces. While additional module guide alignment pins 370 may be used, it has been found that having four module guide alignment pins 370 at the corners of the module provide adequate suppression of vibration and shock.

In a preferred embodiment, as illustrated in FIGS. 1 and 2, the support 136 comprises channels 160 in the chassis 100. At least one bottom channel 162 is present for each slot 165. The bottom channel 162 extends across the bottom opening 130 and is designed to minimally affect the size of the bottom opening 130 and the air flow paths 134 therethrough. In a preferred embodiment, top channels 161 are also provided across the top opening 120 for each of the slots 165. Preferably the top channels 161 are aligned with the bottom channels 161 along the vertical axis VA to minimally affect the air flow paths 134 which are also generally aligned with the vertical axis VA.

The modules 900 have at least one rail 360 for engaging the bottom channel 162 and, in a preferred embodiment, if present, a top rail 361 for engaging the top channel 161. During insertion, the modules 900 are inserted in the insertion direction ID as shown, for instance, in FIG. 1. The bottom rail 360 engage the bottom channel 160 while the module 900 is inserted in the insertion direction ID to the inserted position 901 where the heat sink area 330 is aligned with the bottom opening 130 and the top opening 120 to permit ambient air flow 134 from the bottom opening 130 across the heat sink area 330 and out the top opening 120 to passively cool the electrical components 902 in the module 900. If a top channel 101 is present, in a preferred embodiment, the top rail 361 will engage the top channel 161 while the module 900 is inserted in the inserted direction ID.

Figure 7:
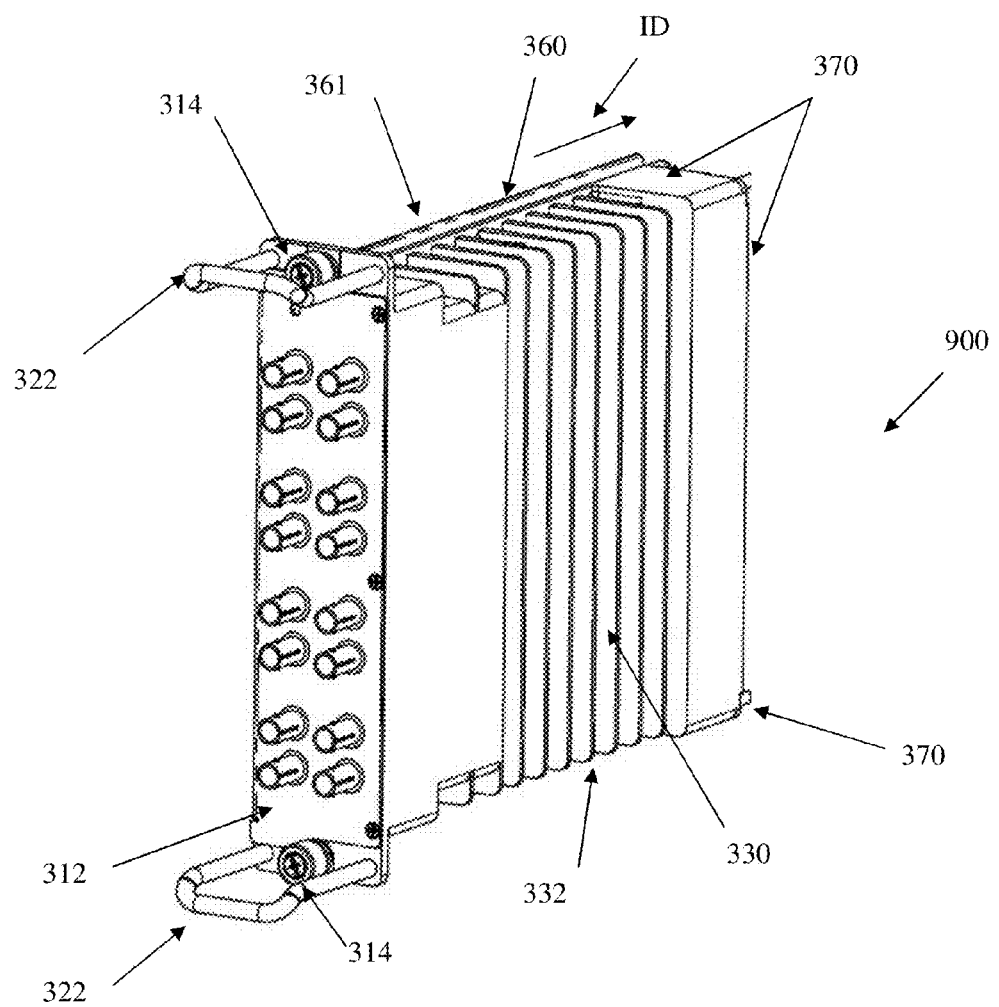
FIG. 7 is an exemplary front perspective view of a module according to one embodiment of the present invention.

As illustrated in FIG. 7, the rails 360, 361 extend in the insertion direction ID along the module 900. In a preferred embodiment, the rails 360, 361 are located remotely from the heat sink area 330 in the module 900. This is in part so that the channel 160, which engages the bottom rail 360, is located remotely from the heat sink area 330 so as not to greatly affect the air flow path 134 around the heat sink area 330. In a preferred embodiment, as illustrated in FIGS. 8A to 8C, the heat sink area 330 is located on a first side wall 391 of the casing 903 and the rails 360 are located on the second side wall 392 which is opposed to the first side wall 391. In this way, the rails 360 and the channels 160 will be located remotely from the heat sink area 330 to lessen their interference with the air flow paths 134.

Figure 4:
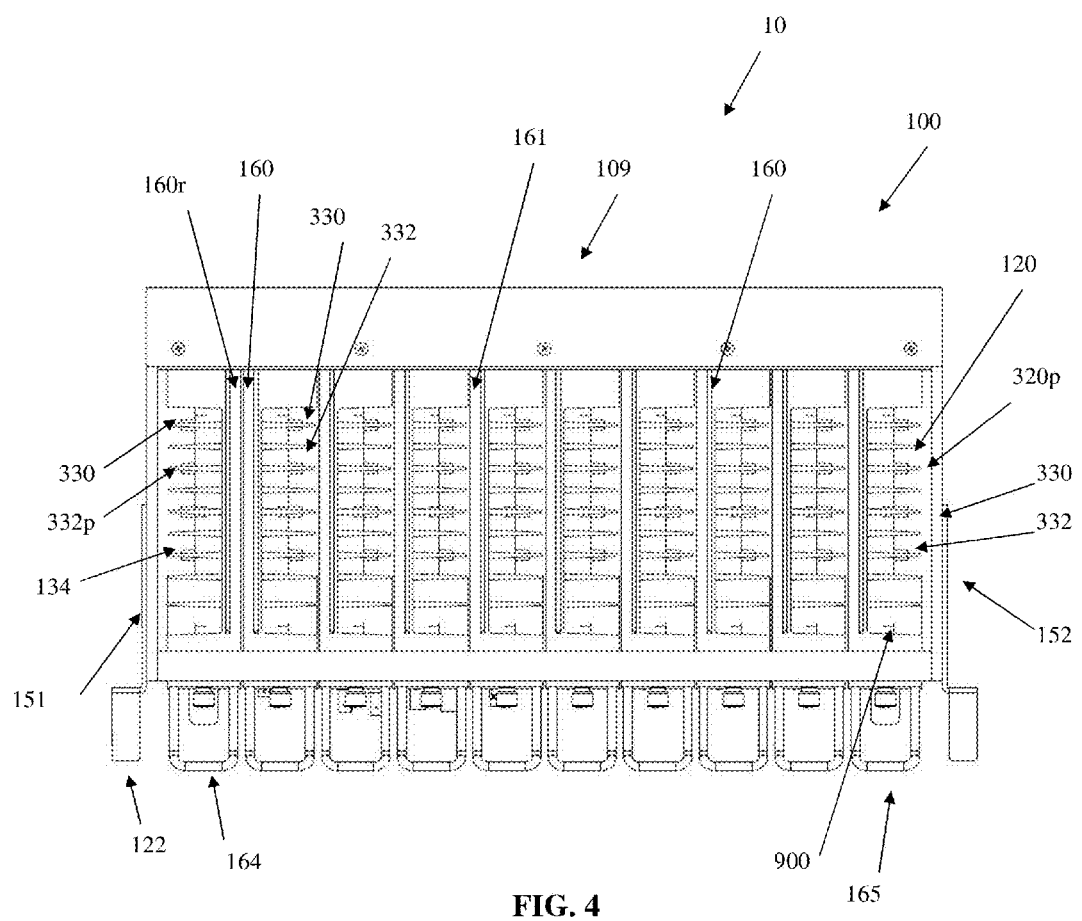
FIG. 4 is an exemplary top plan view of the open-frame modular electronic system shown in FIG. 1.

As best illustrated in FIG. 4, the chassis 100 comprises a reverse channel 160r. The reverse channel 160r permits a module 900 to be inserted in a reverse orientation. As illustrated, for instance in FIG. 4, the heat sink area 330 of each of the modules 900 face to the right, except for the module 900 inserted in the end slot 164. This is designed to permit the heat sink area 330 of the module 900 inserted in the end slot 164 to face the left side opening 151 to increase the air flow 134 across the heat sink area 330. As also illustrated in FIG. 2, the chassis electrical connections 133p at the end slots 164, 165 are reversed. In this way, even though the power modules 320p PM are substantially identical externally, they can be connected at either end slot 164, 165 and still have the heat sink area 330 face out the corresponding side openings 151, 152 as illustrated in FIGS. 5 and 6. This is the case even if the power modules PM 320p are substantially identical externally, including the key housing 336, which decreases the cost of manufacture and also decreases the number of power modules PM 320p that must be purchased by the user because the power module 320p in the end slot 164 will be in a reverse orientation at the inserted position 901.

In a further preferred embodiment, all of the modules 900 have the same external casing. This decreases the cost of manufacture of each of the modules 900 by requiring only a single form to create the case 903. Furthermore, this decreases the cost of maintenance of the modules 900 by permitting the same casing 903 to be used to enclose various types of electrical components 902.

Furthermore, it is preferred that the casing 902 be made of a thermally conductive material in order to permit conduction of heat from the electrical components 902 to the heat sink area 330. In a preferred embodiment, the casing 903 is made from a variety of thermally conductive materials including, but not limited to, aluminium and aluminium alloys. In a preferred embodiment, the casing 903 is manufactured using aluminium alloy die casting. As indicated above, all of the modules 900 are preferably exactly the same having a universal enclosure 903 excluding the key housing 336. The open frame chassis 100 may be formed of adequately rigid materials such as, but not limited to, metals including aluminium alloys, but also including polymers, ceramics and composite materials. While preferred, the material used to manufacture the open frame chassis 100 need not be thermally conductive. However, the materials used to manufacture the open frame chassis 100 should have sufficient rigidity to permit several openings 120, 130, 151, 152 to permit the air flow paths 134 to form.

FIGS. 9A and 9B illustrate the internal heat conduction path of the modules 900. As illustrated in FIGS. 9A and 9B, in this embodiment, the electrical components 902 comprise bottom level optical transceiver heat sources 920 on the daughter PCB 990 and top level optical transceiver heat sources 930 on the main PCB 980. A thermal interface material 970 decreases the contact thermal resistance between the bottom level optical transceiver 920 and the module enclosure front portion 950. The module enclosure front portion 950 may act as a heat sink, even though it does not have fins 331 and also may act as a heat spreader or conductor conducting heat to the heat sink area 330.

In a preferred embodiment, as illustrated in FIGS. 9A and 9B, the heat sink area 330 comprises a modular integrated heat sink fin area 940 which is integrally formed with the overall module casing 903. In particular, the module enclosure front portion 950 and the module integrated heat sink fin area 940 are manufactured from the same integrated component to facilitate the transfer of heat from the bottom level transceiver 920 to the heat sink area 940.

Furthermore, the module 900 comprises a module PCB clamp bar 960 located intermediate and in thermal contact with the top level optical transceiver heat source 930 on the main PCB 980 and the casing 903. In particular, the module PCB clamp bar 960 is in thermal contact with the second wall 392 of the module 900 which, in turn, is in thermal contact with the first wall 391 where the heat sink area 330 is located, and in a preferred embodiment into which the integrated heat sink fin area 940, are formed. In this way, the PCB clamp bar 960 facilitates transfer of heat from the top level optical transceiver 930 and the main PCB 980 to the second wall 392 and the integrated heat sink area 940.

Furthermore, the module 900 comprises an internal heat sink 910. The internal heat sink 910 acts as a heat spreader or a conductor of heat from both the main PCB 980 and the daughter PCB 990 to the heat sink area 330. More particularly, the general heat sink 910 transfers heat from the bottom level optical transceiver 920 and the top level optical transceiver 930 to the heat sink area 330 which, in a preferred embodiment, comprises the integrated heat sink fin area 940. Accordingly, the internal heat spreader 910 is enclosed within the module casing 903 and in thermal contact with the electrical components 902 and facilitates transfer of heat generated by the internal components 902 to the heat sink area 940 internally of the module 900. To further facilitate the transfer of heat from the internal heat spreader 910 to the integrated heat sink fin area 940, the internal heat spreader is fastened to the heat sink area 330, which in this preferred embodiment comprises the integrated heat sink area 940, using thermally conductive fasteners 972 to facilitate the transfer of heat from the internal heat spreader 910 to the integrated heat sink area 940. The thermally conductive fasteners 972 may be manufactured from any conductive materials including aluminium, aluminium alloys, steel, iron and various metals and metal alloys.

It is also understood that the entire casing 903 may be used to transfer heat generated by the electrical components 902 to the heat sink area 940 to passively dissipate heat to the ambient air. Furthermore, the casing 903 will also assist in transferring heat to the ambient air even in portions which do hot have fins 331, such as the module front portion 950 as well as the second wall 392.

As also illustrated in FIGS. 9A and 9B, the module guide alignment pins 370 are preferably formed with the casing 903. In this way, vibration and shock can be lessened. Furthermore, the internal heat spreader 910, because it is located internally of the module 900 and between the main PCB 980 and the daughter PCB 990, further facilitate dampening of vibrations within the module 900. In addition, the module PCB clamp bar 960 is selected such that the main PCB 980 and the daughter PCB 990 are snugly fit within the module 900. This decreases the vibration and shock to the components 902. Furthermore, this also increases the pressure applied between the various electrical components 902 and the thermally conductive components, such as the module enclosure front portion 950 through the thermal interface material 970 on the bottom level optical transceiver 920 to decrease thermal contact resistance and increase the thermal conduction of heat from the bottom level optical transceiver 920, or other electrical or optical components 902, to the heat sink area 330 which, in this preferred embodiment, comprises the integrated heat sink fin area 940.

Accordingly, in operation, the modules 900 may be "hot swappable" into and out of the open frame chassis 100. The modules 900 can be inserted by pushing them in the insertion direction ID into the corresponding slot 165 having electrical connections 133 which are appropriate for the type 320 of module 900 and also can mate with the module electrical connections 333. If an attempt is made to insert a type 320 of module 900 having the module electrical connectors 333 which do not correspond to the chassis electrical connectors 133, the key pins 170 on the back plane 110 will not mate with corresponding module key holes 380, but rather will contact the module key housing 336 preventing insertion of the incorrect module into the inserted position 901. Rather, when the correct type 320 of module 900 for the corresponding slot 163 is inserted in the insertion direction ID, the key pins 170 in the back plane 110 will mate with the module key holes 380 permitting the insertion of the module 900 in the insertion direction ID to the insertion position 901. In the inserted position 901, the chassis electrical connection 133 on the open frame chassis 100 will removably electrically connect the module 900 to the electrical components of the open frame chassis 100. The support 136, which in a preferred embodiment comprises the channels 160, will hold the module 900 at the inserted position 901 where the module 900 is in electrical contact with the chassis electrical connection 133 and where the heat sink area 330 is aligned with the bottom opening 130 and the top opening 120 of the open frame chassis 100 to permit ambient air flow from the bottom opening 130 across the heat sink area 330 and out the top opening 120 to passively cool the electrical components 902 in the module 900.

As discussed above, the module 900 encloses electrical components 902 and has a heat sink area 330 with the electrical components 902 in thermal contact with the heat sink area 330 of the module 900. The casing 903 of the modules 900 are preferably all the same or substantially the same external construction to decrease manufacturing costs and improve ease of use of the module 900. Furthermore, the module guide alignment pins 370 mate with corresponding alignment holes on the chassis 180 to decrease vibration and shock to the module 900 and also assist in finally aligning the module 900 and, in particular, the module connectors 333 to the chassis electrical connectors 133. The panel mount screws 314 are screwed into the open frame chassis 100 adding additional biasing force on the modules 900 in the insertion direction ID to facilitate a connection between the chassis electrical connections 133 and the module electrical connectors 333, as well as engagement of the module guide alignment pins 370 and the alignment holes 180 on the chassis 100.

It is understood that the invention has been described in terms of a system including the open frame chassis 100 and the modules 900 to provide passive cooling of the module electronic system 10. Nevertheless, a fan module (not shown) or other forced air system (not shown) may also be used to facilitate the circulation of air across the modules 900 and, in particular, the fin area 340. Moreover, having the electrical components 902 contained within the modules 902 prevents dirt and dust from coming into contact with the electrical components 902 thereby providing an advantage even if a forced air device (not shown) is used. Furthermore, the fact that large openings 130, 120, as well as side openings 151, 152 are present in the open frame chassis 100, decreases the likelihood that these openings 120, 130, 151 and 152 will become clogged with dust or dirt even if a forced air system (not shown) is continuously used. Furthermore, the modules 900 preferably completely enclose the electrical component 902 and protects them from the fan system (not shown) forcing air having entrained therein dust and dirt which are inherent in harsh environments. Accordingly, while the present system 10 has been designed to passively cool the electrical components 902 in the modules 900, this does not preclude the use of a forced air system (not shown) with the passively cooled module electronic system 10 of the present invention.

It is also understood that while the invention has been described with respect to optical transceiver 920, 930, the invention is not limited to these types of electrical components 902. Rather, the invention can be used with any type of electrical components 902. Furthermore, in this context, electrical components 902 includes electro-optical components and optical components which may generate light, such as laser light, for use with fiber optics and/or optical computer systems.

To the extent that a patentee may act as its own lexicographer under applicable law, it is hereby further directed that all words appearing in the claims section, except for the above defined words, shall take on their ordinary, plain and accustomed meanings (as generally evidenced, inter alia, by dictionaries and/or technical lexicons), and shall not be considered to be specially defined in this specification. Notwithstanding this limitation on the inference of "special definitions," the specification may be used to evidence the appropriate, ordinary, plain and accustomed meanings (as generally evidenced, inter alia, by dictionaries and/or technical lexicons), in the situation where a word or term used in the claims has more than one pre-established meaning and the specification is helpful in choosing between the alternatives.

It will be understood that, although various features of the invention have been described with respect to one or another of the embodiments of the invention, the various features and embodiments of the invention may be combined or used in conjunction with other features and embodiments of the invention as described and illustrated herein.

Although this disclosure has described and illustrated certain preferred embodiments of the invention, it is to be understood that the invention is not restricted to these particular embodiments. Rather, the invention includes all embodiments, which are functional, electrical or mechanical equivalents of the specific embodiments and features that have been described and illustrated herein.

What is claimed is:

1. A passively cooled modular electronic system comprising:
   an open frame chassis;
   a plurality of enclosed modules, each module enclosing electrical components;
   a plurality of chassis electrical connections on the open frame chassis for removably electrically connecting the plurality of modules to the open frame chassis;
   a support for holding each module at the inserted position where each module is in electrical contact with one of the plurality of electrical connections;
   wherein the plurality of modules are selected from two or more types of modules, each type of module having different electrical components enclosed therein and a different module electrical connection for connecting that type of module to a corresponding type of chassis electrical connection; and wherein the open frame chassis comprises key pins associated with each type of chassis electrical connection, the key pins having an orientation on the open frame chassis unique to each type of chassis electrical connection, the key pins mating with corresponding key holes in the type of module which corresponds to that type of chassis electrical connection.

2. The passively cooled modular electronic system as defined in claim 1 wherein the open frame chassis has openings permitting air flow therethrough to cool the modules.

3. The passively cooled modular electronic system as recited in claim 2 wherein each enclosed module has a heat sink area in thermal contact with enclosed electrical components.

4. The passively cooled modular electronic system as defined in claim 3 wherein, when each module is in the inserted position, air may flow through the openings of the open frame chassis and across the heat sink area of each module.

5. The passively cooled modular electronic system as defined in claim 4 wherein the openings of the open frame chassis comprise a bottom opening and a top opening permitting ambient air flow through.

6. The passively cooled modular electronic system as defined in claim 5 wherein, when in the inserted position, the heat sink area of each module is aligned with the bottom opening and the top opening; and
    wherein ambient air is permitted to flow from the bottom opening across the heat sink areas and out the top opening to passively cool the electrical components in the modules.

7. The passively cooled modular electronic system as defined in claim 1 wherein the heat sink area comprises a heat sink fin area having a plurality of fins extending along a vertical axis intersecting the bottom opening and the top opening.

8. The passively cooled modular electronic system as defined in claim 7 wherein the fins are separated by a distance of between 9 mm and 12 mm and have a height of 14 mm to 20 mm.

9. The passively cooled modular electric system as defined in claim 1 wherein the key pins contact the module before the module electrical connection contacts the chassis electrical connection to prevent contact of one type of module electrical connection with a different type of chassis electrical connection.

10. The passively cooled modular electronic system as defined in claim 1 wherein each module comprises two or more module guide alignment pins engaging alignment holes on the open frame chassis for securing the module to the open frame chassis to at least one of assist with final module alignment and decrease susceptibility of the module and the electrical components contained therein to at least one of shock, vibration, and rotational forces.

11. The passively cooled modular electronic system as defined in claim 9
    wherein each module comprises two or more module guide alignment pins engaging guide pin holes on the open frame chassis for securing the module to the open frame chassis;
    wherein the guide alignment pins are located on each of the modules and intersect guide holes on the back plane;
    wherein the key pins are located on the back plane and intersect keyholes on the modules; and
    wherein the key pins extend a greater distance from the back plane than the guide pins extend from the module.

12. The passively cooled modular electronic system as defined in claim 9 wherein the types of modules are selected from control modules CM, power supply modules PM, switch modules SM and communication line modules LM.

13. The passively cooled modular electronic system as defined in claim 1 wherein the support for holding each module comprises:
    at least one channel extending in an insertion direction across the bottom opening;
    at least one rail associated with each module for engaging the at least one channel; and
    wherein during insertion, the at least one rail engages the at least one channel and permits the module to move in the insertion direction to the inserted position if the key pins on the open frame chassis can mate with the key holes in the type of module being inserted.

14. The passively cooled modular electric system as defined in claim 9 wherein each type of module has a substantially identical casing.

15. The passively cooled electronic system as defined in claim 2
    wherein the back plane of the open frame chassis terminates at first and second ends of the open frame chassis, and the openings comprise a first opening at the first end and a second opening at the second end;
    wherein the plurality of modules includes power modules (PM) and each power module PM has a substantially identical casing;
    wherein a first power module can be placed at the first end of the open frame chassis with the heat sink area of the first power module exposed at least partially through the first opening at the first end of the open frame chassis; and
    wherein a second power module can be placed at the second end of the open frame chassis such that the heat sink area of the second power module is exposed at least partially through the second opening of the second end of the open frame chassis.

16. The passively cooled modular electronic system as defined in claim 1 wherein the module further comprises:
    an internal heat spreader encased within the module and in thermal contact with the electrical components and the heat sink area to transfer heat generated from the electrical components to the heat sink area internally of the module.

17. The passively cooled modular electronic system as defined in claim 1 wherein the module enclosing the electrical components comprises:
    a main Peripheral Circuit Board (PCB) containing the electrical components; and
    a PCB clamp bar in thermal contact with the PCB and the heat sink area to transfer heat generated from the electrical components to the heat sink area.

18. The passively cooled modular electronic system as defined in claim 16 further comprising thermally conductive fasteners to fasten the internal heat spreader to the heat sink area and facilitate transfer of heat from the internal heat spreader to the heat sink area; and
    wherein the module comprises a thermally conductive casing to transfer heat generated from the electrical components to the heat sink area and to passively dissipate heat to the ambient air.

19. The passively cooled modular electronics system as defined in claim 1 wherein at least one module comprises:
    a casing for completely enclosing electronic components therein;

an electrical connector for connecting the module to the open frame chassis; and a heat sink area in thermal contact with the electrical components.

20. The passively cooled modular electronic system as defined in claim 19 wherein the at least one module further comprises:

at least one rail on the casing located remotely from the heat sink area and extending along the casing in an insertion direction; and wherein, during insertion of the module into the open frame chassis in the insertion direction, the at least one rail engages at least one corresponding channel in the open frame chassis to support the module at the inserted position.

21. The passively cooled modular electronic system as defined in claim 19 wherein the at least one module further comprises:

an internal heat spreader in thermal contact with the electrical components to transfer heat generated by the electrical components to the heat sink area internally of the module.

22. The passively cooled modular electronic system as defined in claim 19 wherein the heat sink area of the at least one module comprises:

a heat sink fin area having a plurality of fins extending along a vertical axis intersecting the top opening and the bottom opening of the open frame chassis, the fins separated by a distance of 6 mm and 14 mm and having a height of 14 mm to 20 mm.

* * * * *